(12) United States Patent
Wei et al.

(10) Patent No.: US 10,270,453 B2
(45) Date of Patent: Apr. 23, 2019

(54) COARSE DELAY LOCK ESTIMATION FOR DIGITAL DLL CIRCUITS

(71) Applicant: Intel Corporation, Santa Clara, CA (US)

(72) Inventors: Fangxing Wei, Folsom, CA (US); Khushal Chandan, Folsom, CA (US); Dan Shi, Folsom, CA (US); Michael Allen, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 217 days.

(21) Appl. No.: 15/089,523

(22) Filed: Apr. 2, 2016

(65) Prior Publication Data

US 2017/0288683 A1 Oct. 5, 2017

(51) Int. Cl.
*H03L 7/081* (2006.01)
*H03L 7/091* (2006.01)
*G11C 11/56* (2006.01)
*G11C 7/14* (2006.01)
*H03L 7/10* (2006.01)

(52) U.S. Cl.
CPC .............. *H03L 7/0814* (2013.01); *G11C 7/14* (2013.01); *G11C 11/56* (2013.01); *H03L 7/0816* (2013.01); *H03L 7/0818* (2013.01); *H03L 7/091* (2013.01); *H03L 7/10* (2013.01)

(58) Field of Classification Search
CPC .............................. H03L 7/093; H03L 7/091
See application file for complete search history.

(56) References Cited

U.S. PATENT DOCUMENTS

| | | | | |
|---|---|---|---|---|
| 7,474,136 | B2* | 1/2009 | Heightley | G11C 7/1051 327/158 |
| 8,482,326 | B2* | 7/2013 | Miyano | H03L 7/087 327/156 |
| 9,407,273 | B1* | 8/2016 | Wei | H03L 7/0816 |
| 2008/0197899 | A1 | 8/2008 | Gomm et al. | |
| 2010/0214858 | A1 | 8/2010 | Kang et al. | |
| 2012/0154001 | A1 | 6/2012 | Seo | |

OTHER PUBLICATIONS

Hsieh et al.; "A 6.7 MHz to 1.24 GHz 0.0318 mm$^2$ Fast-Locking All-Digital DLL Using Phase-Tracing Delay Unit in 90 nm CMOS"; IEEE Journal of Solid-State Circuits; Feb. 2016; p. 412-427; vol. 51 No. 2; IEEE Service Center, Piscataway, NJ, USA.
International Search Report for PCT application No. PCT/US2017/020988 filed Mar. 6, 2017; dated Jun. 19, 2017; 14 pages.

* cited by examiner

Primary Examiner — Hai L Nguyen
(74) Attorney, Agent, or Firm — Thorpe North and Western, LLP; David W. Osborne

(57) ABSTRACT

Digital delay locked loop circuits, devices systems, and associated methods are provided and described. Such devices, systems, and methods utilize an open loop measurement for establishing a coarse delay lock.

19 Claims, 9 Drawing Sheets

COARSE DELAY LOCK ESTIMATION FOR DIGITAL DLL CIRCUITS

BACKGROUND

Computer devices and systems have become integral to the lives of many, and include all kinds of uses from social media to intensive computational data analysis. Such devices and systems can include tablets, laptops, desktop computers, network servers, and the like. Memory subsystems play an important role in the implementation of such devices and systems, and are one of the key factors affecting performance.

Every computer contains one or more internal clocks that regulate the rate at which instructions are executed and synchronizes all the various computer components. For example, the central processing unit (CPU) requires a fixed number of clock ticks (e.g. clock cycles) to execute each instruction. Other components such as expansion buses can also have a clock. The Joint Electron Device Engineering Council (JEDEC) defines various Double Data Rate (DDR) specifications with memory interface and device operations on both the rising and falling edges of a system clock signal. This gives DDR-compliant devices the capability to move information, such as command and address signals, in some cases, at nearly twice the rate than previously possible.

BRIEF DESCRIPTION OF THE DRAWINGS

Features and advantages of technology embodiments will be apparent from the detailed description which follows, taken in conjunction with the accompanying drawings, which together illustrate, by way of example, technology features; and, wherein.

Figure 1:
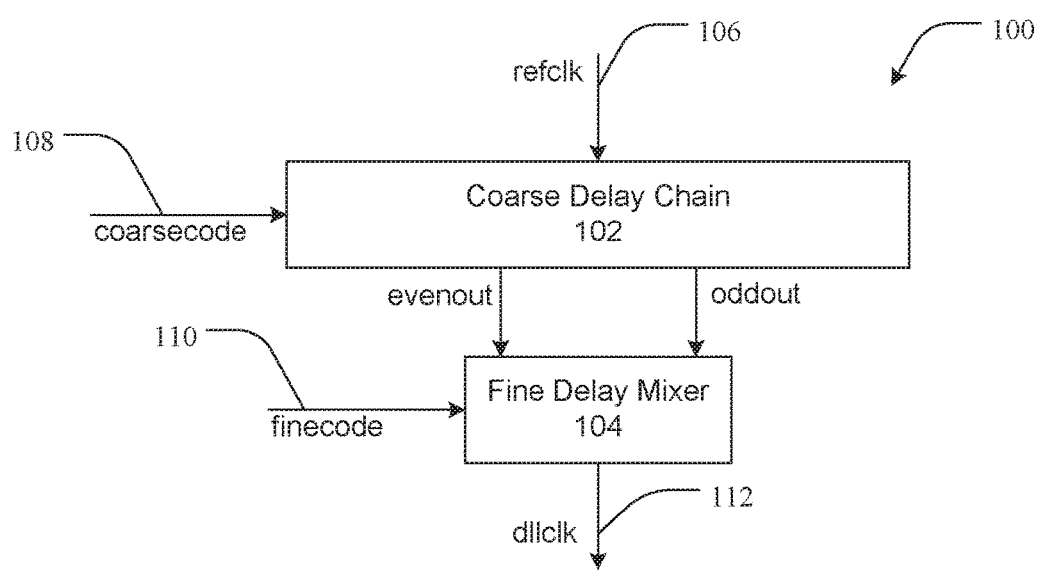
FIG. 1 is a block diagram of a variable delay circuit.

Reference will now be made to the exemplary embodiments illustrated, and specific language will be used herein to describe the same. It will nevertheless be understood that no limitation on technology scope is thereby intended.

DESCRIPTION OF EMBODIMENTS

Before the disclosed invention embodiments are described, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular examples or embodiments only and is not intended to be limiting. The same reference numerals in different drawings represent the same element. Numbers provided in flow charts and processes are provided for clarity in illustrating steps and operations and do not necessarily indicate a particular order or sequence.

Furthermore, the described features, structures, or characteristics can be combined in any suitable manner in one or more embodiments. In the following description, numerous specific details are provided, such as examples of layouts, distances, network examples, etc., to provide a thorough understanding of various technology embodiments. One skilled in the relevant art will recognize, however, that such detailed embodiments do not limit the overall inventive concepts articulated herein, but are merely representative thereof.

As used in this written description, the singular forms "a," "an" and "the" include express support for plural referents unless the context clearly dictates otherwise. Thus, for example, reference to "a bit line" includes a plurality of such bit lines.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term in this written description, like "comprising" or "including," it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

As used herein, "enhanced," "improved," "performance-enhanced," "upgraded," and the like, when used in connection with the description of a device or process, refers to a characteristic of the device or process that provides measurably better form or function as compared to previously known devices or processes. This applies both to the form and function of individual components in a device or process, as well as to such devices or processes as a whole.

As used herein, "coupled" refers to a relationship of physical or electrical connection or attachment between one item and another item, and includes relationships of either direct or indirect connection or attachment. Any number of items can be coupled, such as materials, components, structures, layers, devices, objects, etc.

As used herein, "directly coupled" refers to a relationship of physical or electrical connection or attachment between one item and another item where the items have at least one point of direct physical contact or otherwise touch one another. For example, when one layer of material is deposited on or against another layer of material, the layers can be said to be directly coupled.

Objects or structures described herein as being "adjacent to" each other may be in physical contact with each other, in close proximity to each other, or in the same general region or area as each other, as appropriate for the context in which the phrase is used.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

In this application, the term "about" when used in connection with a numerical value is used to provide flexibility and indicate that a given value may be "a little above" or "a little below" the specific stated numerical value. It is to be understood that in this written description, the occurrence of the term "about" with a numerical value also provides express support for the exact numerical value as though the term "about" were not present.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 1.5, 2, 2.3, 3, 3.8, 4, 4.6, 5, and 5.1 individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

EXAMPLE EMBODIMENTS

An initial overview of technology embodiments is provided below and specific technology embodiments are then described in further detail. This initial summary is intended to aid readers in understanding the technology more quickly, but is not intended to identify key or essential technological features, nor is it intended to limit the scope of the claimed subject matter.

Memory is a dynamic input/output (I/O) interface in computing devices, which is present throughout an ever-changing technological landscape ranging from high-performance devices, such as computer servers, to low-power devices, such as smartphones. Robust memory supports enhancements in device speed, latency, and power consumption across various platforms. Clock utilization strategies can significantly affect the overall memory performance achieved.

A clock generator produces a clock signal that oscillates between a high and a low state that is used to coordinate the timing of computational systems, devices, peripherals, circuits, and the like. One common clock signal is a square wave with a 50% duty cycle, often with a fixed and constant frequency. Circuits using the clock signal can trigger or become active on the rising edge (the positive edge), the falling edge (the negative edge), or both the rising and falling edges of the clock signal. In some cases, a clock signal can be gated by a control signal to alter the timing of the clock signal, to inactivate the clock signal during certain phases or periods, and the like.

A memory subsystem operating at a Double Data Rate (DDR), for example, can transfer data to and from memory in a source synchronous manner on both the positive and negative edges of a clock signal. DDR-compliant memory is generally connected to a memory controller via a memory interface having various bus channels that transmit command and address signals (command/address or CA), clock signals, and data being read from or written to the DDR memory. The CA signal group contains command signals from the memory controller to the DDR-compliant memory providing read/write and other instructions, and address signals that provide the physical location of the requested read or write data.

The technology described herein can be compatible with a number of memory technologies, such as DDR (various specifications depending on DDR version, published by JEDEC), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), HBM2 (HBM version 2, currently in discussion by JEDEC), and/or others, and technologies based on derivatives or extensions of such specifications. Additionally, unless noted otherwise, "DDR" refers to any implementation of DDR, such as DDR, DDR2, DDR3, DDR4, DDR5, and the like. DDR and DDRx can thus be used interchangeably. DDR specifications are overseen and published by JEDEC, including, for example, DDR4 (DDR version 4, initial specification published in September 2012 by JEDEC), DDR5 (DDR version 5, currently in discussion by JEDEC), and so on. It is noted that any such compatible memory technology is considered to be within the present scope.

DDR subsystems utilize various data strobe (DQS) signals to notify the receiver of the data transfer timing. DQS is a bidirectional strobe signal that functions as the basic operating clock for data (DQ) read/write operations, which can ease timing inaccuracies between DQ transmissions and the system clock, particularly at higher frequencies. The DQS is thus an oscillating signal that validates and aligns DQ with the system clock. It is noted that the term "DQS" also includes differential strobing designs.

In order to properly function and ease timing inaccuracies, the system clock and the DQS are initially synchronized, at least when the system is powered up. Additionally, the DQS can drift out of alignment with the system clock. When this happens, it is desirable to bring the DQS and clock back into alignment. One technique for re-aligning and tracking DQS/system clock synchronization employs a delay locked loop (DLL) circuit. DLL circuits generally operate in two phases: a coarse phase to quickly find a coarse lock position and a fine phase to track the locking position with minimum phase error. Any skew between the two clock signals can be accounted for by introducing a delay into the timing of the DQS that facilitates alignment. In one example, the coarse phase can be utilized at power up to establish a coarse delay code that aligns the clock phases to an approximation based on the duration of a series of coarse time increments. Once the proper coarse delay code has been established, the fine phase can divide the coarse time increments into a series of fine time increments, and thus further refine the alignment between the clock signals at this finer level of detail. As the device operation proceeds, clock alignment is tracked by at least one of these mechanisms.

Mixed signal DLLs are used in conventional DDR memory interfaces. One configuration, for example, is based upon self-biasing techniques in which all bias voltages and currents are referenced to other generated bias voltages and currents. Another configuration is based upon a dual loop DLL architecture for continuously checking a running clock. One loop generates eight equally spaced reference clocks, and the other loop multiplexes between selected successive reference clocks to generate the desired recovered clock. However, in some cases mixed signal DLL architectures can consume a large amount of power. Furthermore, in many DLL implementations, a phase detector (PD), such as a Bang-Bang (BB) PD, is used to guide the DLL loop to its lock position (i.e. the coarse lock position). The BB PD, however, can false lock at the clock falling edge, and can be easily affected by noise.

In other examples, a DDRIO interface supporting the DDR JEDEC specification can be used with various types of memory (DRAM, NAND flash, 3DXP, etc.) for data manipulation and/or storage. For DDRIO to support the DDR JEDEC specification, the DQ/DQS should be aligned with the external clock. Digital DLLs can be widely used in various DDRIO designs, at least in part in order to save power compared to mixed signal DLL architectures. In conventional DDR memory interfaces, the digital DLL coarse tracking phase and the fine tracking phase are often accomplished via closed loop-feedback mechanisms with the aid of a PD, such as the BB PD.

The presently disclosed embodiments comprise a measurement-based technique to find the DLL coarse lock position, after which the DLL is placed into a tracking mode following coarse lock. In one example, a DLL introduces a delay from the pad clock input of the interface to the DQ/DQS pad outputs that is an integral number of clock periods. In other words, the DLL coarse delay code (or coarse code) is varied until an integral clock period delay is reached across the whole DDR analog delay path. In this way, the DQ/DQS become aligned with the external clock. Accordingly, the measurement scheme for determining the delay is referred to as "N-measure." The digital DLL circuit is thus in an open-loop mode as the coarse code delay is determined, and then placed into a closed-loop mode for tracking. This technique can beneficially reduce or eliminate the DLL loop sensitivity to the phase detector in its locking process.

Thus, the DLL is placed into close-loop tracking/lock mode using the coarse delay code and fine delay code to minimize the digital DLL tracking phase error. Because the measurement scheme puts the digital DLL in an open-loop mode that does not use the PD to find the coarse lock, the DLL loop sensitivity to phase detectors in its locking process will be reduced or eliminated, and the DLL-locking process from a close-loop search to an open-loop search will be simplified. When the digital DLL is switched to the close-loop tracking/lock mode, the phase detector will be used to guide its tracking/lock.

DDR interfaces, such as DDRIO for example, thus include a DLL circuit to align the DQ/DQS at the interface output pads to an external clock at an interface input pad. The presently disclosed embodiments relate to devices, systems, and methods comprising an open loop measurement-based technique to determine the coarse delay code (or coarse lock position). Once determined, the DLL is coarse delay locked at the coarse delay code and placed into tracking mode. The tracking mode can include traditional closed-loop implementations utilizing fine delay-based tracking, coarse delay-based tracking, or both.

In one embodiment, a compare circuit coupled between a pair of shift registers can be used to implement and perform the N-measurement scheme on both positive clock edge and negative clock edge. If the negative and positive edge measurements yield the same results, the DLL is in coarse lock with the current DLL coarse code. In one example, the DLL circuit can send a low-to-high transition to the N-measure circuit to enable a high shift inside the shift registers, and send the low-to-high transition into the DDRIO analog delay path. The shifting of the shift registers is driven by the external clock. When the low-to-high transit goes through the entire DDRIO analog delay path and comes back to the N-measure circuit, the shift of the shift registers is stopped. The contents inside the shift registers will thus be the N-measure results.

FIG. 1 shows one example embodiment of a digitally-controlled variable delay chain 100 for introducing the coarse delay code into the DQS (dllclk). The coarse delay code (or coarse code) represents a coarse delay adjustment that is applied to the external clock signal by the DLL circuit in order to align the DQ/DQS at the interface output pads to the external clock received at an interface input pad. The variable delay chain 100 comprises a coarse delay chain 102 and fine delay mixer 104. The coarse delay chain 102 has larger delay steps compared to the fine delay mixer 104, such as, for example, 1 to 2 digital gate delay(s). The fine delay mixer 104 segregates the coarse delay step into shorter duration increments to further refine the clock alignment. The coarse delay chain 102 receives an external reference clock 106 (refclk) and a coarse code 108, and outputs even phase and odd phase clocks to the fine delay mixer 104. The mixer 104 adds in new clock edges between these two edges to generate fine delay steps. The larger coarse code delay step can help the digital DLL to reach its lock position faster, and the mixed small fine step can help reduce digital DLL phase error when in lock mode to allow a DDR interface to meet the JEDEC timing specs. The coarse delay chain 102 can be any delay mechanism, such as, for example, a long digital gate chain with multiples of two numbers of gates. The minimum coarse step or delay increment can be an inverter delay in some cases. In one example, a two NAND gate delay can be used as a digital gate delay. The mixer can thus be used to interpolate new edges from the two even/odd clock phases selected out from the coarse delay chain. This can further divide down the coarse delay step into smaller fine steps to reduce digital DLL lock phase error.

Figure 2:
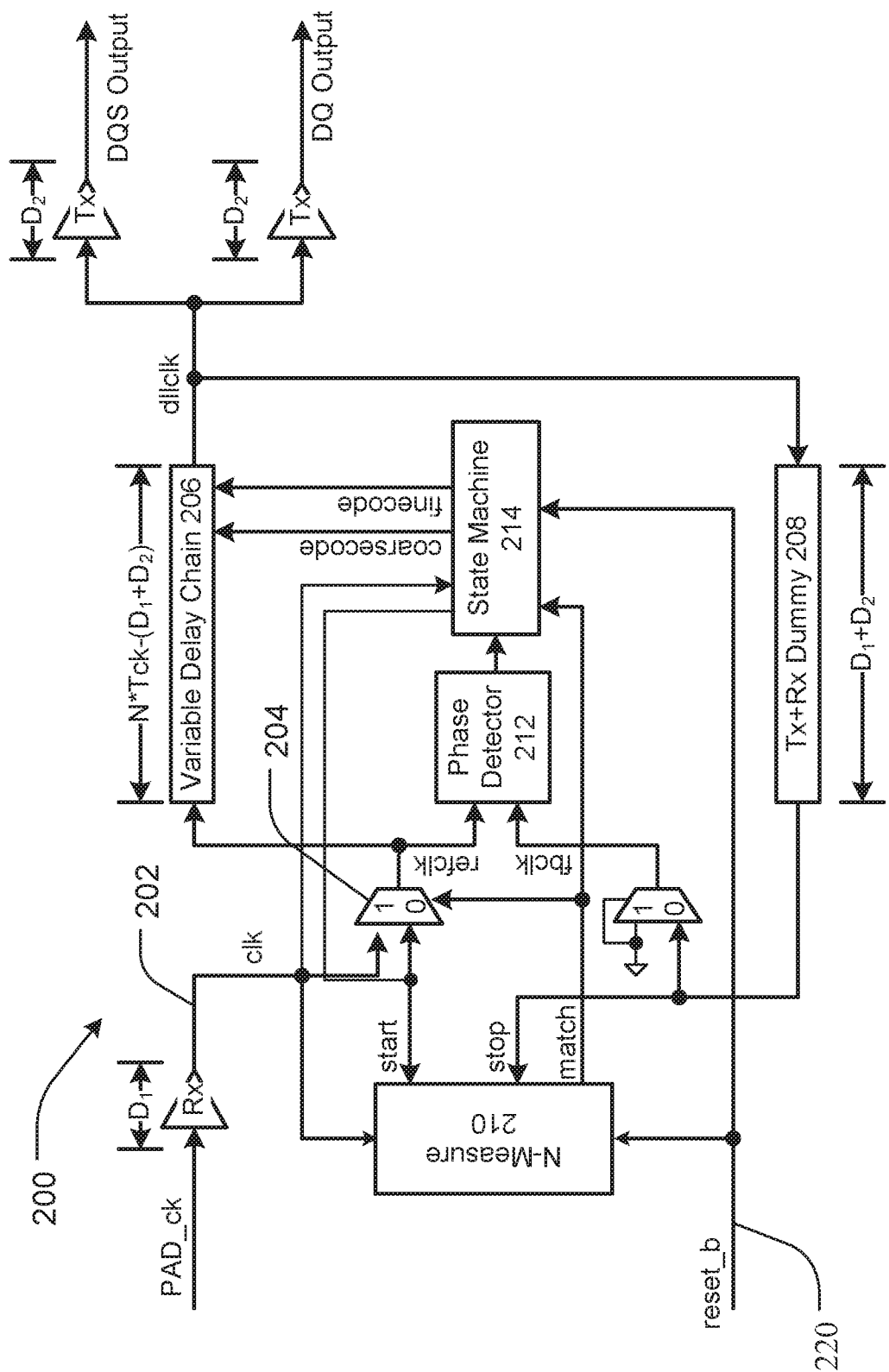
FIG. 2 is a schematic diagram of an example implementation of a DLL circuit.

FIG. 2 shows an example embodiment of a DLL circuit 200 implementation, having an external clock input 202 (clk) that is multiplexed at multiplexer 204 with the N-measure circuit. In one multiplex path, N-measure controls the digital DLL to coarse lock position in open-loop mode. In the other multiplex path, the digital DLL is in close-loop mode. The N-measure circuit 210 determines whether or not there was an integral number of reference clock periods within the time window measured for both the positive clock edges and the negative clock edges. If so, the DQS is locked at the current coarse delay code, and the DLL circuit 200 is placed into a closed loop tracking mode using the phase detector 212 and the state machine 214. If the number of clock periods are not the same for both the positive clock edges and the negative clock edges, the coarse delay code is updated in the state machine 214, by 1, for example, and the process is repeated. Additionally, a reset_b input 220 to the DLL circuit 200 is coupled to the N-measure circuit 210 and the state machine 214. When the power is turned on, the reset_b signal from the reset_b input 220 is inserted to activate the N-measure circuit-based coarse delay code search portion of the DLL circuit 200. To do the N-measure-based open-loop lock position estimation, the digital DLL state machine will send a low-to high transit signal "start" to the N-measure circuit. This low-to high transit signal "start" will pass the DDRIO analog delay path and come back to the N-measure circuit as "stop" to stop the measurement. If the N-measure circuit output "match" is high, the current coarse code inside DLL state machine will be the estimated coarse lock position. If not, the coarse code inside the DLL state machine will be increased by a delay increment, and the above-described measurement process is repeated until the N-measure circuit output "match" is high. The variable delay chain 206 can use the reference clock (refclk), the coursecode from the state machine 214, and the finecode from the state machine 214 to make both course and fine adjustments to the DQ/DQS. Then the digital DLL is switched to the close-loop tracking/lock mode. As such, FIG. 2 is a non-limiting example of a circuit that can be used by a DDR interface, such as a DDRIO interface, for example, to align the DQ/DQS at the interface output pads to an external clock received at an interface input pad. A dummy delay circuit 208 can be coupled in the reference clock delay loop between the variable delay circuit and the N-measure circuit 210.

Figure 3:
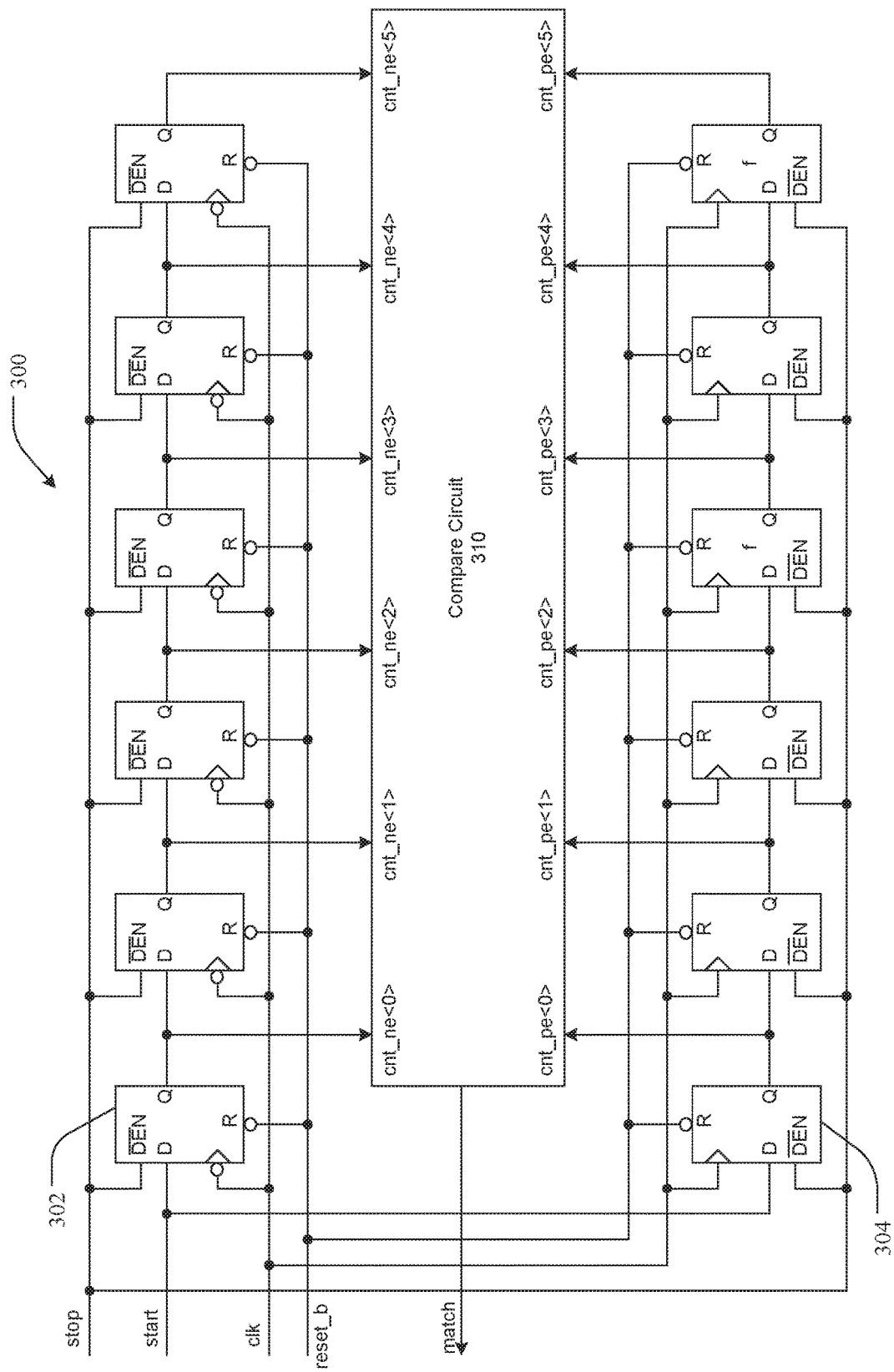
FIG. 3 is a schematic diagram of an example implementation of an N-measurement circuit.

FIG. 3 shows one example embodiment of an N-measure circuit 300 (N-circuit). The N-circuit 300 comprises a pair of shift registers including a first shift register comprising a plurality of first flip flops 302 and a second register comprising a plurality of second flip flops 304. All flip flops receive a reset_b input for power-on initialization, and the first flip-flop 304 receives a start input from the state machine 214. The state machine 214 sends a low to high transition to the N-circuit 300 at the "start" input, which loads a high value into the D register of the first of the plurality of first flip flops 302 and into the first of the plurality of second flip flops 304. Both sets of flip flops receive a clk input, and thus will be driven by the clk signal; however, the plurality of first flip flops 302 will respond to the negative clock edge, while the plurality of second flip flops 304 will respond to the positive clock edges. As such, with each clk cycle, the high value sent from the state machine 214 will shift to the next flip flop in the register, with the preceding flip flop again receiving a high value from the state machine 214. In this manner, high values will populate the shift registers from left to right with each clk cycle at either the negative or positive edge, depending on the shift register. If, when the stop signal transits from low to high (or in other words, at the end of the delay test window), the pair of shift registers contain the same N-measurement value, then the DLL is in coarse lock with the current DLL coarse delay code. The pair of shift registers are compared with a compare circuit 310.

Figure 4:
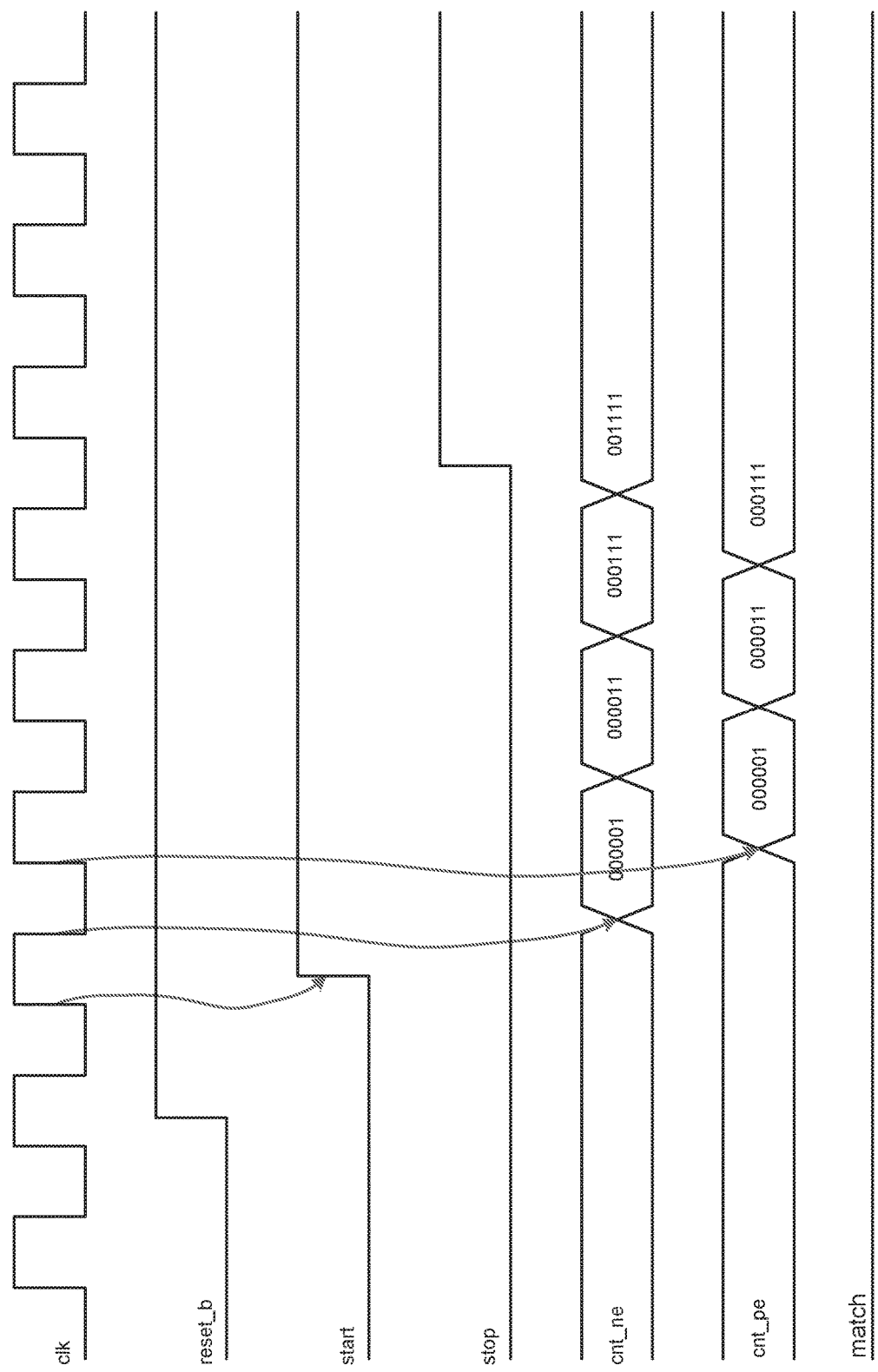
FIG. 4 is a graphical representation of a timing diagram of an N-measurement circuit.

FIG. 4 shows the example waveforms of the N-measure unmatched operation. The N-measure circuit has two shift registers and one compare circuit. One shift register is clocked with positive clock edge, and the other is clocked with negative clock edges. When a "start" signal transits from low to high, this high input will be shifted along the two shift registers until a "stop" signal transits from low to high. The contents of the two shift registers at "stop"=1 will be the N-measure results. If they are equal, the "match" output will be high, and the coarse lock position will have been found. If they are not equal, the "match" output will stay at low, the coarse code inside the DLL state machine will be increased by 1, and the above described measurements will be repeated until they are equal.

As a specific example shown in FIG. 4, where the delay test window is bounded by the start and stop transitions. The first shift register shifts in response to each negative clock edge (cnt_ne), and the second shift register shifts in response to each positive clock edge (cnt_pe). In this example, the first shift register responded to 4 negative clock edges, and thus attains the N-measurement value of 001111. The second shift register responded to 3 positive clock edges before the stop input closed the delay test window, or more specifically, inactivated all of the flip flops. As a result, the second shift register attains the N-measurement value of 000111. As these N-measurement values are not equal, the compare circuit would not indicate a match. The time from the "start" positive edge to the "stop" positive edge is the total DDRIO analog delay from pad clock input to the DQ/DQS pad outputs. During this period of time, the two shift registers can shift in high, as shown in the waveforms. If the number of shifts in both shift registers are the same, the compare logic will set the "match" output to high, and the digital DLL is in a coarse lock position.

Figure 5:
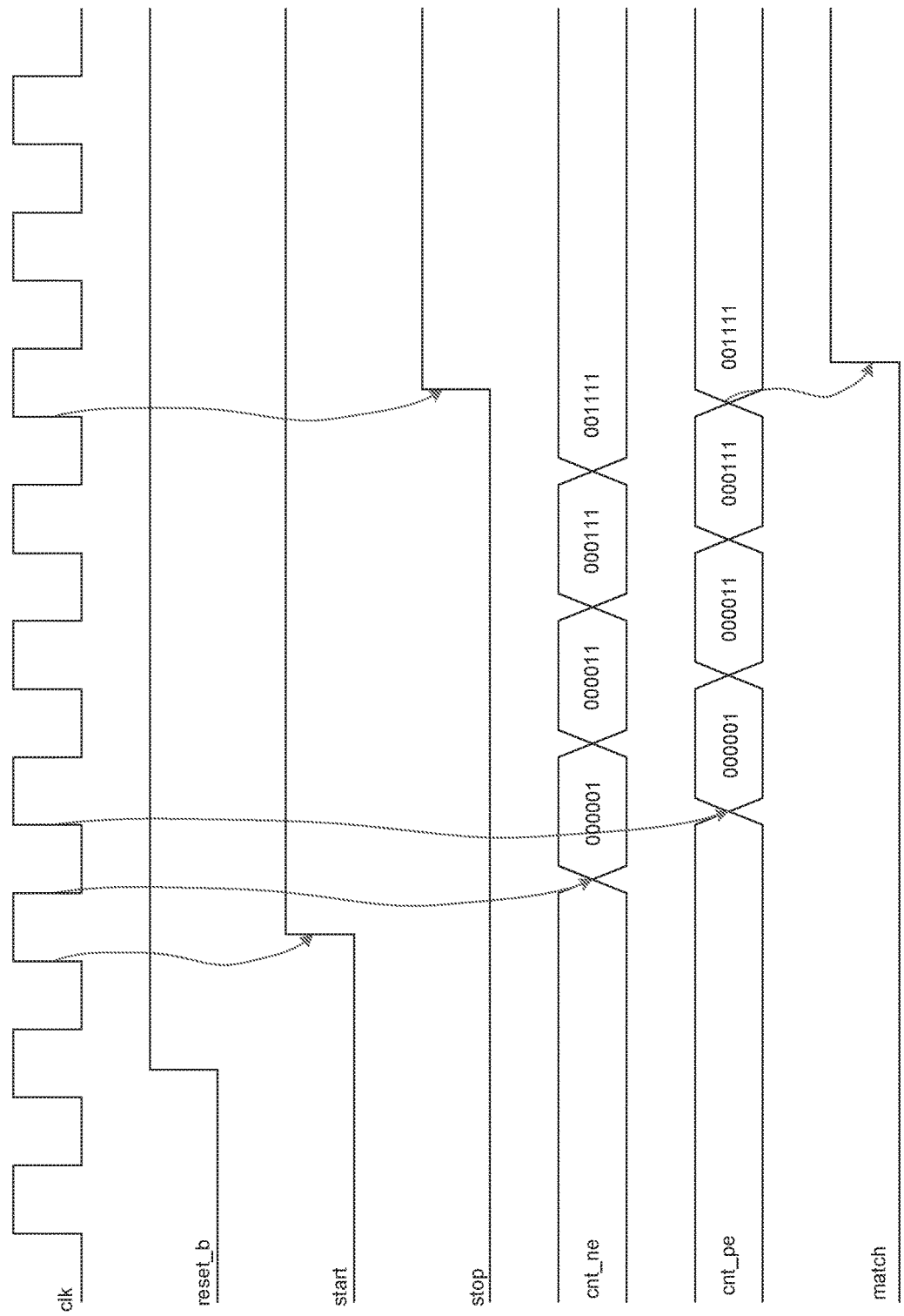
FIG. 5 is a graphical representation of a timing diagram of an N-measurement circuit.

FIG. 5 shows example waveforms of the N-measure matched operation. During the shifting period of time, if the number of shifts in both shift registers are the same, the "match" signal will transit to high, and the digital DLL state machine will switch the digital DLL to close-loop tracking mode. The delay test window is again bounded by the start and stop transitions. The first shift register shifts in response to each negative clock edge (cnt_ne), and the second shift register shifts in response to each positive clock edge (cnt_pe). In this example, the first shift register responded to 4 negative clock edges as in FIG. 4, and thus attains the N-measurement value of 001111. The second shift register responded to 4 positive clock edges before the stop input inactivated all of the flip flops, and thus attains the N-measurement value of 001111. As these N-measurement values are equal, the compare circuit would indicate a match, and send a match signal to the state machine 214.

Figure 6:
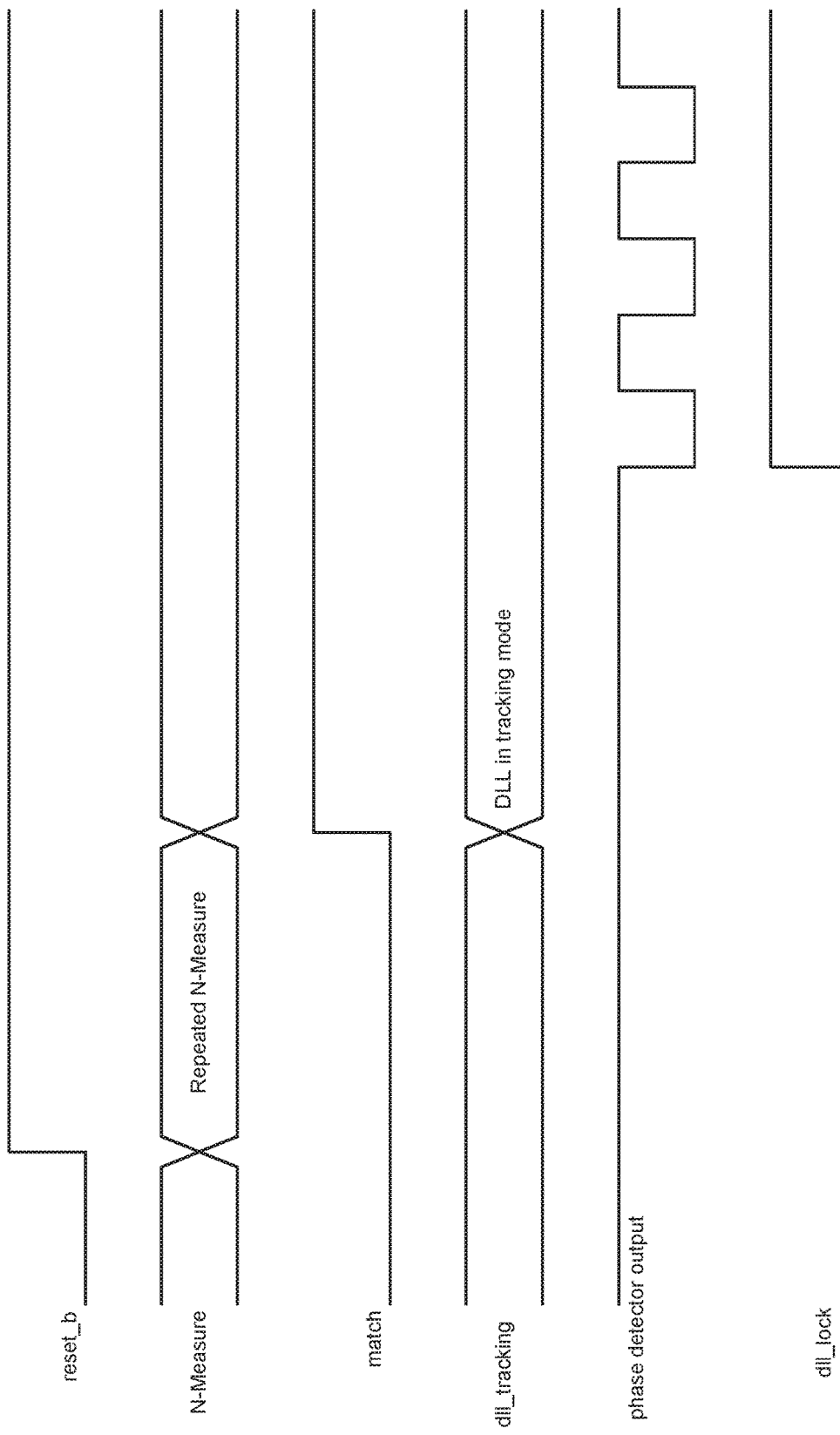
FIG. 6 is a graphical representation of a timing diagram of a DLL circuit.

FIG. 6 a sequence of the digital DLL locking process using the open loop coarse delay code estimation. After the DLL circuit is released from reset state, the state machine begins to operate the N-measure function to search for the appropriate coarse delay code. When the "match" signal from the compare circuit 310 is high, the state machine 214 will switch to tracking/lock mode. When phase detector output begins to toggle or transition, the DLL circuit is in the lock state, DLL lock will be flagged, and will proceed in tracking mode.

Figure 7:
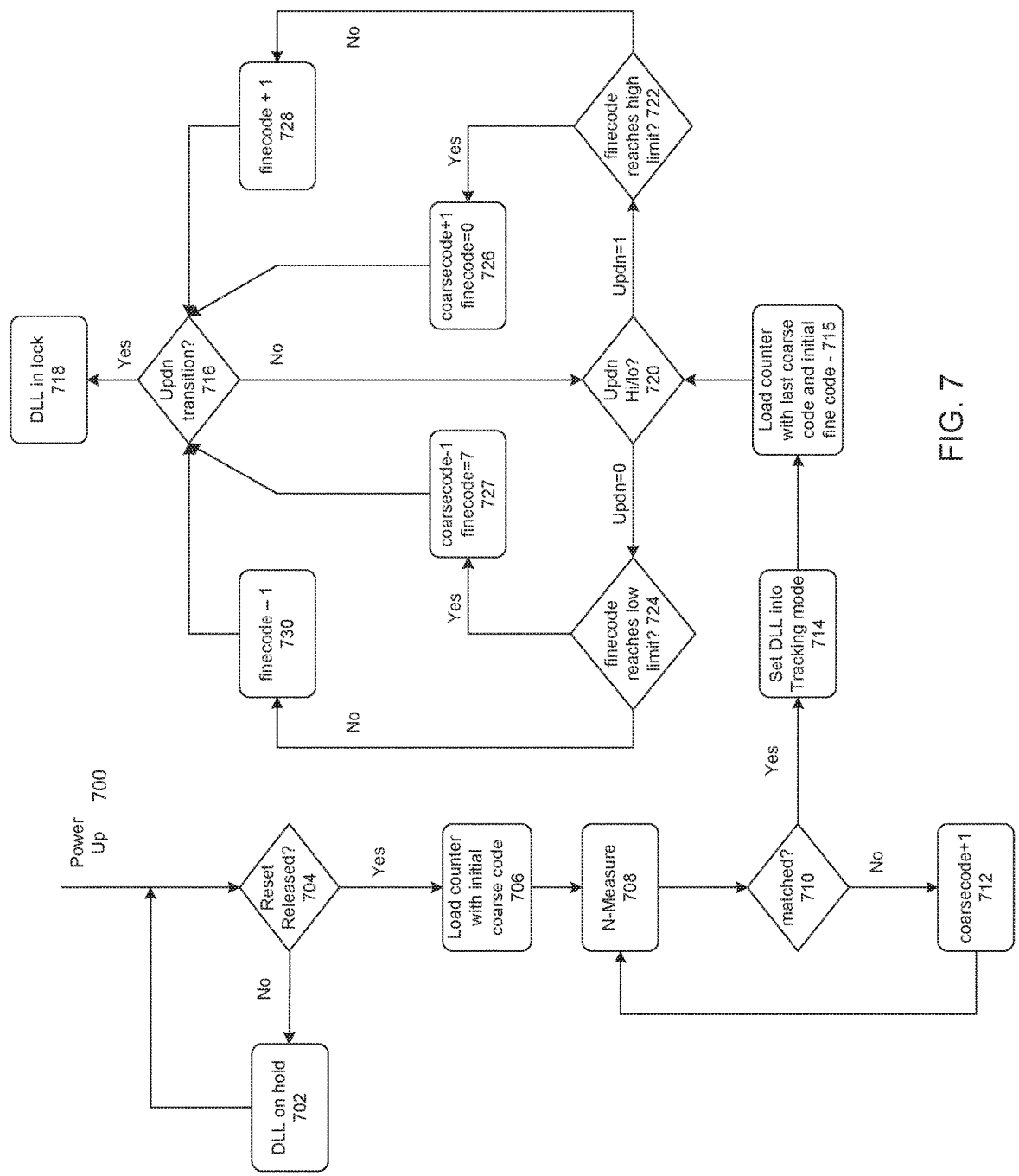
FIG. 7 is an operational diagram of a state machine of a DLL circuit.

FIG. 7 shows an operational diagram of one example embodiment of a DLL state machine to control: 1) the N-measure for coarse lock estimation: and 2) DLL fine locking and tracking. Starting with the N-measure-based coarse lock estimation portion of the DLL circuit, upon power-up 700 the digital DLL is in a reset state, on hold 702 and waiting for reset to be released 704. Until the reset is released 704, the digital DLL remains operationally on hold in the reset state. Following release 704 of the reset, the DLL state machine is loaded with the initial coarse code 706. While not necessarily depicted in FIG. 7, it should be understood that in some embodiments, the initial course code can be loaded while the state machine remains in the reset state awaiting reset release 704. After reset is released 704, and the initial course code is loaded 706, the N-measure circuit begins the N-measure 708 (e.g. begins to measure), the pad-to-pad analog delay of the DLL circuit, as has been described. If the results of the positive and negative edge shift registers do not match 710, the state machine increases 712 the coarse code by 1, and the N-measure circuit repeats measure 708 until a match 710 is obtained. When the results of the positive and negative edge shift registers reach a match 710, the DLL circuit is locked to the current coarse code and set to tracking mode 714. At this point, the matched coarse code and an initial fine code are loaded into the counter 715 of the state machine.

Once in tracking mode, the DLL circuit enters a fine code tracking loop beginning at 720 to more finely tune the synchronization of the clock signals. In the fine code tracking loop, the digital DLL fine code is incrementally increased 728 or decreased 730 by the state machine according to the output 720 of the phase detector (e.g., phase detector 212 of FIG. 2). This fine code tracking loop continues to increase or decrease the fine code until the phase detector transitions at 716, indicating that fine code lock has been achieved. When the phase detector output transitions 716, the digital DLL is flagged as locked 718, and the state machine is locked in that state. In one example, the output 720 of the phase detector 212 is monitored for a change in phase indicative of a potential locking loss. If a change in phase is detected based on the phase detector output 720 (i.e., Updn is Hi or Lo), the fine code tracking loop is again initiated, and the fine code is again incrementally varied (728 or 730), until a lock state is again achieved.

For example, if the phase detector 212 is outputting a high output signal (Updn is high), then the fine code is increased to increase the delay of the strobe signal to decrease the phase offset. If the phase detector 212 is outputting a low output signal (Updn is low), then the fine code is decreased to decrease the phase delay of the strobe signal to decrease the phase offset. The phase offset is thus decreased until the phase detector output transits, or otherwise transitions to zero, indicating that the locked state has been achieved. In some cases, the transit to the locked state can include the output signal fluctuating or toggling back and forth around the zero output signal state.

Because the number of fine code increments is an integral number of the course code duration, there is a limit to the number of times the fine code can be adjusted for a given coarse code duration range. If the fine code reaches either a high 722 or a low 724 limit, the DLL circuit adjusts the coarse code so that fine code tracking can continue as previously described. If the fine code reaches a high limit 722, the coarse code is increased by one 726 and the fine code is set to zero. If the fine code reaches a low limit, the coarse code is decreased by one 727 and the fine code is set to the fine code high limit. As the coarse code in this nonlimiting example is divided into 8 fine code increments, the fine code is shown set to its high limit of 7. The high and low limits of the fine code represent a range throughout which the state machine can use the fine code increment to fine-tune the clock alignment. These limits are due to the integral number of increments into which the coarse code has been divided, and the number of fine code clock edges that can be detected within that range. At the lower limit of the present example, for instance, decreasing the fine code by the $7^{th}$ increment (i.e. to a total of 7 increments) is equivalent to decreasing the course code by 1 increment. As such, the coarse code is decreased by 1 increment, and the fine code is reset to the other end of the fine code range. In the upper limit situation, the course code is increased by 1 increment, and the fine code is reset to the lower end of the fine code range to zero.

Figure 8:
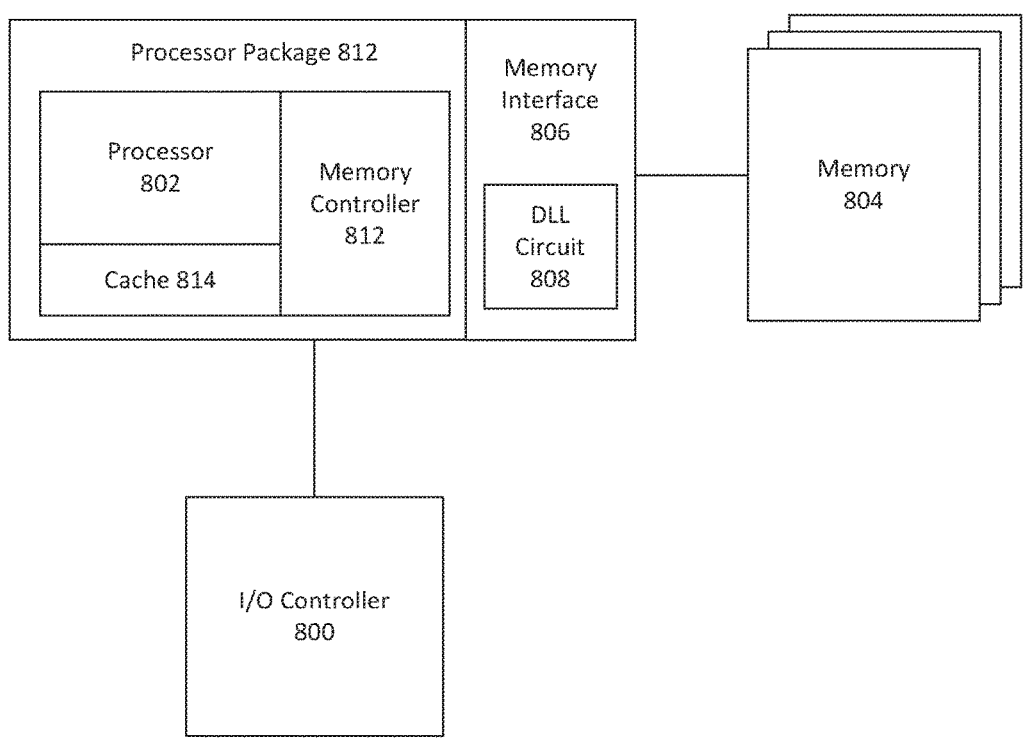
FIG. 8 is a schematic diagram of an example implementation of a system including a DLL circuit.

In one example embodiment, as is shown in FIG. 8, a computing system is provided comprising a processor 802, a memory 804, a memory interface 806 further comprising a DLL circuit 808, and a memory controller 810 coupled to the processor 802 and to the memory 804 through the memory interface 806. In one example, the memory controller 810 can be integrated with the processor 802, and thus be an integrated memory controller in a processor package 812. In other examples, the memory controller can be distinct and separate from the processor. The processor package 812 can additionally include a cache memory 814 coupled to the processor 802. The system can further comprise an input/output (I/O) controller coupled to the processor package 812. The I/O controller can interface with and/or control various components of the computing system, such as user interface devices, memory storage devices, universal serial bus (USB) devices, peripheral component interconnect (PCI) devices, PCI express devices, audio, networking, and the like.

The memory interface can include any type of memory interface that benefits from synchronizing a data clock, such as a data strobe, with the system or other external clock. Nonlimiting examples of memory interfaces includes DDRx, WIO2, HBM, HBM2, and others, including data transmission technologies based on derivatives or extensions of such specifications. In one specific example, the memory interface is a DDR interface. In another specific example, the memory interface is a DDRIO interface. Additionally, in some examples the memory interface is integrated with the memory controller, either as part of an integrated controller or a separate controller element from the processor.

Various types of memory can be utilized in the present systems, devices, and methods, and can include volatile (or transient) memory, non-volatile (or non-transient) memory, or both. Non-limiting examples of volatile and non-volatile memory can include various random access memory (RAM) configurations, such as dynamic RAM (DRAM), synchronous DRAM (DDR SDRAM), synchronous static RAM (DDR SRAM), single or multi-threshold level NAND flash memory, NOR flash memory, single or multi-level phase change memory (PCM), resistive memory, three dimensional (3D) cross point memory, nanowire memory, ferroelectric transistor random access memory (FeTRAM), magnetoresistive random access memory (MRAM) memory that incorporates memristor technology, spin transfer torque random access memory (STT)-MRAM, write in place non-volatile MRAM (NVMRAM) such as phase change memory, and the like, including combinations thereof. Additionally, it is understood that the term "machine-readable storage medium" includes any type of volatile or non-volatile storage device that is accessible by a processor.

The processor can be a single processor, multiple processors, or a multiple core processor or processors. A local communication interface can couple the processor or processors to other components of the system, including cache memory, memory controllers, memory, the I/O controller, various interfaces, and the like.

Portions of the disclosed embodiments may be implemented, in some cases, in hardware, firmware, software, or any combination thereof. Portion of the disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

Figure 9:
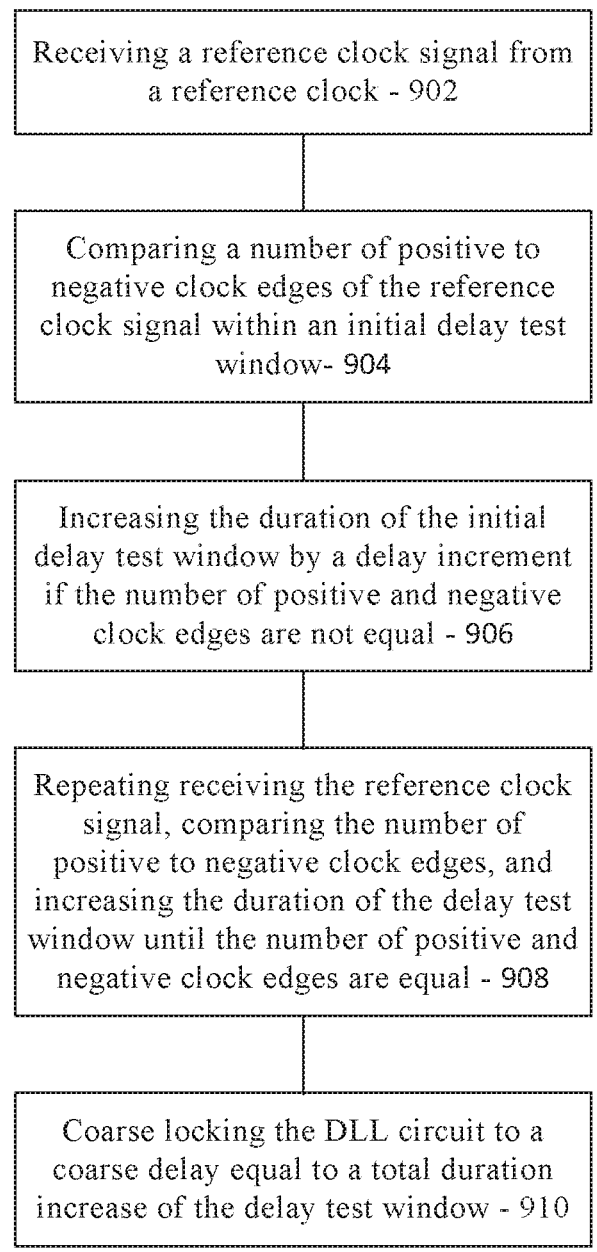
FIG. 9 is a flow diagram of a method of open-loop coarse-locking a DLL circuit.

In another example embodiment, as is shown in FIG. 9, a method of open-loop coarse-locking a DLL circuit includes: at 902 receiving a reference clock signal from a reference clock. At 904: comparing, using a compare circuit coupled between a pair of shift registers, a number of positive clock edges of the reference clock signal to a number of negative clock edges of the reference clock signal within an initial delay test window. At 906: increasing, using a state machine, the duration of the initial delay test window by a delay increment if the number of positive clock edges does not equal the number of negative clock edges. At 908: repeating receiving the reference clock signal, comparing the number of positive to negative clock edges, and increasing the duration of the delay test window until the number of positive and negative clock edges in the delay test window are equal. At 910: coarse locking the DLL circuit to a coarse delay equal to a total duration increase of the delay test window.

Additionally, the open-loop digital DLL course-locking techniques have numerous benefits over traditional digital DLL designs. For example, N-measure output can function as a test feature for a memory interface (e.g. a DDRIO interface) to report the total analog delay from pad clock input to DQ/DQS pad outputs. In another example, the N-measure output can be utilized to set timing trimming inside a memory controller to control the IO latency. Further example benefits include lowering the importance of the phase detector in the DLL locking process, thus reducing the noise sensitivity and the chance to lock to negative clock edges, as well as preventing the DLL circuit from harmonic locking. Additionally, in other examples, the N-measure technique can reduce coarse code overshoot caused by phase detector output latency, and can reduce the DLL locking time.

EXAMPLES

The following examples pertain to specific embodiments and point out specific features, elements, or steps that can be used or otherwise combined in achieving such embodiments.

In one example there is provided, an electronic device, comprising:
delay-locked loop (DLL) circuitry configured to:
receive a reference clock signal from a reference clock source;
compare a number of positive clock edges of the reference clock signal to a number of negative clock edges of the reference clock signal within an initial delay test window;
increase the duration of the initial delay test window by a delay increment if the number of positive clock edges does not equal the number of negative clock edges;
repeat receipt of the reference clock signal, comparison of the number of positive to negative clock edges, and increase the duration of the delay test window until the number of positive and negative clock edges in the delay test window are equal; and
coarse lock a strobe signal to the reference clock signal with a coarse delay equal to a total duration increase of the delay test window.

In one example of an electronic device, the DLL circuitry is further configured to:
maintain the locking of the strobe signal to the reference clock signal with a closed negative feedback loop.

In one example of an electronic device, the device further comprises a double data rate (DDR) compatible interface coupled to the DLL circuitry.

In one example of an electronic device, the initial delay test window has a duration equal to the DDR interface analog delay path.

In one example of an electronic device, the delay increment is a duration of at least one reference clock cycle.

In one example of an electronic device, to compare the number of positive to negative clock edges, the DLL circuitry is further configured to:

pass the reference clock signal through a pair of shift registers, where one shift register is triggered on positive clock edges and the other shift register is triggered on negative clock edges; and compare, using a compare circuit, the number of positive clock edges passing through one of the pair of shift registers to the number of negative clock edges passing through the other of the pair of shift registers during the delay test window.

In one example of an electronic device, the DLL circuitry is further configured to:

send a start transition to the pair of shift registers to start the delay test window; and send the start transition through an analog delay path and to the pair of shift registers to stop the delay test window.

In one example there is provided, a delay locked-loop (DLL) circuit, comprising:

a closed loop fine delay tracking circuit;

a variable delay circuit;

an open loop coarse delay matching circuit to determine a coarse delay code by testing a current coarse delay code, further comprising:

a pair of shift registers each comprised of a plurality of flip flops configured such that one of the pair of shift registers is responsive to positive clock edges and the other is responsive to negative clock edges;

a reference clock input to each flip flop;

a compare circuit coupled between the pair of shift registers;

a state machine coupled to a first flip flop of each of the pair of shift registers, and configured to introduce a high value into each first flip flop; and a reference clock delay loop coupled from the reference clock input through the variable delay circuit to each flip flop, and configured to de-activate the pluralities of flip flops.

In one example of a DLL circuit, the state machine is configured to:

hold the current coarse delay code; and update the current coarse delay code when, upon inactivation of the pluralities of flip flops, a match state is low from the compare circuit.

In one example of a DLL circuit, the update to the current coarse delay is an increase of the duration of the current coarse delay.

In one example of a DLL circuit, the pair of shift registers are configured to shift the high value along each shift register with each cycle of the reference clock, wherein each shift register holds a value representing the number of positive or negative clock edges experienced by the respective shift register.

In one example of a DLL circuit, the compare circuit is configured to:

compare the value stored in each shift register upon inactivation of the pluralities of flip flops; and output a match signal to the state machine when the values stored in each shift register are equal.

In one example of a DLL circuit, the state machine, in response to receipt of a match signal, is further configured to:

lock the DLL circuit with the current coarse delay code; and activate the fine delay tracking circuit.

In one example of a DLL circuit, the circuit further comprises a dummy delay circuit coupled in the reference clock delay loop between the variable delay circuit and the pluralities of flip flops.

In one example there is provided an open loop coarse delay matching circuit, comprising:

a variable delay circuit;

a pair of shift registers each comprised of a plurality of flip flops configured such that one of the pair of shift registers is responsive to positive clock edges and the other is responsive to negative clock edges;

a reference clock input to each flip flop;

a compare circuit coupled between the pair of shift registers;

a state machine coupled to a first flip flop of each of the pair of shift registers, and configured to introduce a high value into each first flip flop; and a reference clock delay loop coupled from the reference clock input through the variable delay circuit to each flip flop, and configured to deactivate the pluralities of flip flops.

In example of an open loop coarse delay matching circuit, the state machine is configured to:

hold the current coarse delay code; and update the current coarse delay code when, upon inactivation of the pluralities of flip flops, a match state is low from the compare circuit.

In example of an open loop coarse delay matching circuit, the update to the current coarse delay is an increase of the duration of the current coarse delay.

In example of an open loop coarse delay matching circuit, the pair of shift registers are configured to shift the high value along each shift register with each cycle of the reference clock, wherein each shift register holds a value representing the number of positive or negative clock edges experienced by the respective shift register.

In example of an open loop coarse delay matching circuit, the compare circuit is configured to:

compare the value stored in each shift register upon inactivation of the pluralities of flip flops; and output a match signal to the state machine when the values stored in each shift register are equal.

In example of an open loop coarse delay matching circuit, the state machine, in response to receipt of a match signal, is further configured to:

lock the DLL circuit with the current coarse delay code; and activate a fine delay tracking circuit.

In example of an open loop coarse delay matching circuit, the circuit further comprises a dummy delay circuit coupled in the reference clock delay loop between the variable delay circuit and the pluralities of flip flops.

In one example there is provided, a method of open-loop coarse-locking a delay-locked loop (DLL) circuit, comprising:

receiving a reference clock signal from a reference clock;

comparing, using a compare circuit coupled between a pair of shift registers, a number of positive clock edges of the reference clock signal to a number of negative clock edges of the reference clock signal within an initial delay test window;

increasing, using a state machine, the duration of the initial delay test window by a delay increment if the number of positive clock edges does not equal the number of negative clock edges;

repeating receiving the reference clock signal, comparing the number of positive to negative clock edges, and increasing the duration of the delay test window until the number of positive and negative clock edges in the delay test window are equal; and coarse locking the DLL circuit to a coarse delay equal to a total duration increase of the delay test window.

In one example of a method of open-loop coarse-locking a delay-locked loop (DLL) circuit, the method further comprises, upon coarse locking the DLL circuit, placing the DLL circuit into a closed-loop tracking mode.

In one example of a method of open-loop coarse-locking a delay-locked loop (DLL) circuit, the delay increment has a duration that is a multiple of the reference clock signal period.

In one example of a method of open-loop coarse-locking a delay-locked loop (DLL) circuit, comparing the number of positive clock edges to the number of negative clock edges further comprises:

passing the reference clock signal through the pair of shift registers, where one shift register is triggered on positive clock edges and the other shift register is triggered on negative clock edges; and comparing, using the compare circuit, the number of positive clock edges passing through one of the pair of shift registers to the number of negative clock edges passing through the other of the pair of shift registers during the delay test window.

In one example of a method of open-loop coarse-locking a delay-locked loop (DLL) circuit, the method further comprises:

sending a start transition to the pair of shift registers to start the delay test window; and sending the start transition through an analog delay path of the DLL circuit and to the pair of shift registers to stop the delay test window.

In one example there is provided, a computing system, comprising:

a processor;

a memory;

a memory interface comprising a delay locked-loop (DLL) circuit as recited herein; and a memory controller coupled to the processor and to the memory through the memory interface.

In one example of a computing system, the state machine is configured to:

hold the current coarse delay code; and update the current coarse delay code when, upon inactivation of the pluralities of flip flops, a match state is low from the compare circuit.

In one example of a computing system, the update to the current coarse delay is an increase of the duration of the current coarse delay.

In one example of a computing system, the pair of shift registers are configured to shift the high value along each shift register with each cycle of the reference clock, wherein each shift register holds a value representing the number of positive or negative clock edges experienced by the respective shift register.

In one example of a computing system, the compare circuit is configured to:

compare the value stored in each shift register upon inactivation of the pluralities of flip flops; and output a match signal to the state machine when the values stored in each shift register are equal.

In one example of a computing system, the state machine, upon receiving a match signal, is further configured to:

lock the DLL circuit with the current coarse delay code; and activate the fine delay tracking circuit.

In one example of a computing system, the system further comprises a dummy delay circuit coupled in the reference clock delay loop between the variable delay circuit and the pluralities of flip flops.

In one example of a computing system, the memory interface is a double data rate (DDR) compatible interface and the memory is a DDR-compliant memory.

In one example of a computing system, the DDR interface is a DDRIO interface.

While the forgoing examples are illustrative of the principles of invention embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A delay locked-loop (DLL) circuit, comprising:
a closed loop fine delay tracking circuit;
a variable delay circuit;
an open loop coarse delay matching circuit to determine a coarse delay code by testing a current coarse delay code, further comprising:
a pair of shift registers each comprised of a plurality of flip flops configured such that one of the pair of shift registers is responsive to positive clock edges and the other is responsive to negative clock edges;
a reference clock input to each flip flop;
a compare circuit coupled between the pair of shift registers;
a state machine coupled to a first flip flop of each of the pair of shift registers, and configured to introduce a high value into each first flip flop; and
a reference clock delay loop coupled from the reference clock input through the variable delay circuit to each flip flop, and configured to de-activate the plurality of flip flops.

2. The circuit of claim 1, wherein the state machine is configured to:
hold the current coarse delay code; and
update the current coarse delay code when, upon inactivation of the plurality of flip flops, a match state is low from the compare circuit.

3. The circuit of claim 2, wherein the update to the current coarse delay code is an increase of a duration of the current coarse delay.

4. The circuit of claim 1, wherein the pair of shift registers are configured to shift the high value along each shift register with each cycle of the reference clock input, wherein each shift register holds a value representing a number of positive or negative clock edges experienced by the respective shift register.

5. The circuit of claim 4, wherein the compare circuit is configured to:
compare the value stored in each shift register upon inactivation of the plurality of flip flops; and
output a match signal to the state machine when values stored in each shift register are equal.

6. The circuit of claim 5, wherein the state machine, in response to receipt of the match signal, is further configured to:
lock the DLL circuit with the current coarse delay code; and
activate the fine delay tracking circuit.

7. The circuit of claim 1, further comprising a dummy delay circuit coupled in the reference clock delay loop between the variable delay circuit and the plurality of flip flops.

8. A computing system, comprising:
a processor;
a memory;

a memory interface comprising a delay locked-loop (DLL) circuit as in claim 1; and a memory controller coupled to the processor and to the memory through the memory interface.

9. The system of claim 8, wherein the state machine is configured to:

hold the current coarse delay code; and update the current coarse delay code when, upon inactivation of the plurality of flip flops, a match state is low from the compare circuit.

10. The system of claim 8, wherein the pair of shift registers are configured to shift the high value along each shift register with each cycle of the reference clock input, wherein each shift register holds a value representing a number of positive or negative clock edges experienced by the respective shift register.

11. The system of claim 8, further comprising a dummy delay circuit coupled in the reference clock delay loop between the variable delay circuit and the plurality of flip flops.

12. The system of claim 8, wherein the memory interface is a double data rate (DDR) compatible interface and the memory is a DDR-compliant memory.

13. An open loop coarse delay matching circuit, comprising:

a variable delay circuit;

a pair of shift registers each comprised of a plurality of flip flops configured such that one of the pair of shift registers is responsive to positive clock edges and the other is responsive to negative clock edges;

a reference clock input to each flip flop;

a compare circuit coupled between the pair of shift registers;

a state machine coupled to a first flip flop of each of the pair of shift registers, and configured to introduce a high value into each first flip flop; and a reference clock delay loop coupled from the reference clock input through the variable delay circuit to each flip flop, and configured to de-activate the plurality of flip flops.

14. The circuit of claim 13, wherein the state machine is configured to:

hold a current coarse delay code; and update the current coarse delay code when, upon inactivation of the plurality of flip flops, a match state is low from the compare circuit.

15. The circuit of claim 14, wherein the update to the current coarse delay code is an increase of a duration of the current coarse delay.

16. The circuit of claim 14, wherein the pair of shift registers are configured to shift the high value along each shift register with each cycle of the reference clock input, wherein each shift register holds a value representing a number of positive or negative clock edges experienced by the respective shift register.

17. The circuit of claim 16, wherein the compare circuit is configured to:

compare the value stored in each shift register upon inactivation of the plurality of flip flops; and output a match signal to the state machine when values stored in each shift register are equal.

18. The circuit of claim 17, wherein the state machine, in response to receipt of the match signal, is further configured to:

lock the open loop coarse delay matching circuit with the current coarse delay code; and activate a fine delay tracking circuit.

19. The circuit of claim 13, further comprising a dummy delay circuit coupled in the reference clock delay loop between the variable delay circuit and the plurality of flip flops.

* * * * *